United States Patent
Tsironis

(10) Patent No.: US 9,653,332 B1
(45) Date of Patent: May 16, 2017

(54) WAFER PROBE HOLDER FOR PLANARITY AND ORIENTATION ADJUSTMENT

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 370 days.

(21) Appl. No.: 14/108,600

(22) Filed: Dec. 17, 2013

Related U.S. Application Data

(60) Provisional application No. 61/748,234, filed on Jan. 2, 2013.

(51) Int. Cl.
  *H01L 21/68* (2006.01)
  *H01L 21/687* (2006.01)
  *H01L 21/677* (2006.01)

(52) U.S. Cl.
  CPC ........ *H01L 21/68* (2013.01); *H01L 21/67742* (2013.01); *H01L 21/68707* (2013.01)

(58) Field of Classification Search
  CPC ............... H01L 21/68; H01L 21/68707; H01L 21/67742; G01N 22/00; G01N 22/04; G01R 27/32; G01D 5/145; G01B 7/30; G01B 7/003
  See application file for complete search history.

(56) References Cited

U.S. PATENT DOCUMENTS

| | | | | |
|---|---|---|---|---|
| 5,345,170 A * | 9/1994 | Schwindt | ................. | A46D 1/00 324/750.19 |
| 5,804,507 A * | 9/1998 | Perlov | ..................... | B24B 57/02 134/33 |
| 6,049,216 A * | 4/2000 | Yang | ................... | G01R 31/2863 324/750.18 |
| 6,316,953 B1 * | 11/2001 | Yang | ................... | G01R 31/2863 324/750.16 |
| 6,629,883 B2 * | 10/2003 | Katsuoka | .............. | B24B 37/345 451/332 |
| 6,921,466 B2 * | 7/2005 | Hongo | .................. | B24B 37/345 118/719 |
| 7,275,468 B2 * | 10/2007 | Montesanti | ............. | B23B 29/04 82/1.11 |
| 7,560,942 B2 * | 7/2009 | Fleischer | ........... | G01R 31/2891 324/756.02 |

(Continued)

OTHER PUBLICATIONS

"High-frequency Performance with Low, Stable Contact Resistance on Aluminum Pads", Infinity probe, [online] Cascade Microtech, [retrieved on Dec. 17, 2013]. Retrieved from the Internet: <URL: http://www.cascademicrotech.com/products/probes/rf-microwave/infinity-probe/infinity-probe>.

(Continued)

*Primary Examiner* — Michael Zarroli

(57) ABSTRACT

A compact device allows individual or combined correction of wafer probe planarity and orientation misalignment. The device is made as a metallic block or as a strong plastic block and contains three sections, which are held together by a steel blade or by a steel blade and a rotation pin; the sections are split apart for "Phi"—orientation alignment or rotated against each-other for "Theta" planarity alignment. The steel blade provides secure and anti-backlash flexibility both in lateral ("Phi") and perpendicular ("Theta") direction. Alternatively the "Theta" alignment can use a rotation shaft or a small part of the original block left over as a bridge joining both sections. The device is inserted between the fixed probe support and the probe itself.

9 Claims, 21 Drawing Sheets probe holder assembly with orientation (Φ) and planarity (θ) correction tools (top view)

(56) References Cited

U.S. PATENT DOCUMENTS

| | | | | |
|---|---|---|---|---|
| 7,595,651 B2* | 9/2009 | Ku | ............... | G01R 1/07342 |
| | | | | 324/755.07 |
| 8,593,616 B2* | 11/2013 | Hong | ............... | F16H 25/183 |
| | | | | 279/2.1 |
| 8,933,707 B1* | 1/2015 | Tsironis | ............ | G01R 1/06772 |
| | | | | 324/207.13 |
| 2010/0128237 A1* | 5/2010 | Okamoto | ............ | G03B 27/54 |
| | | | | 355/55 |

OTHER PUBLICATIONS

"High Performance Microwave Probes", Model 40M Low Loss Picoprobe, [online], GGB Industries Inc., [retrieved on Dec. 17, 2013]. Retrieved from the Internet:<URL:http://www.ggb.com/40m.html>.

* cited by examiner

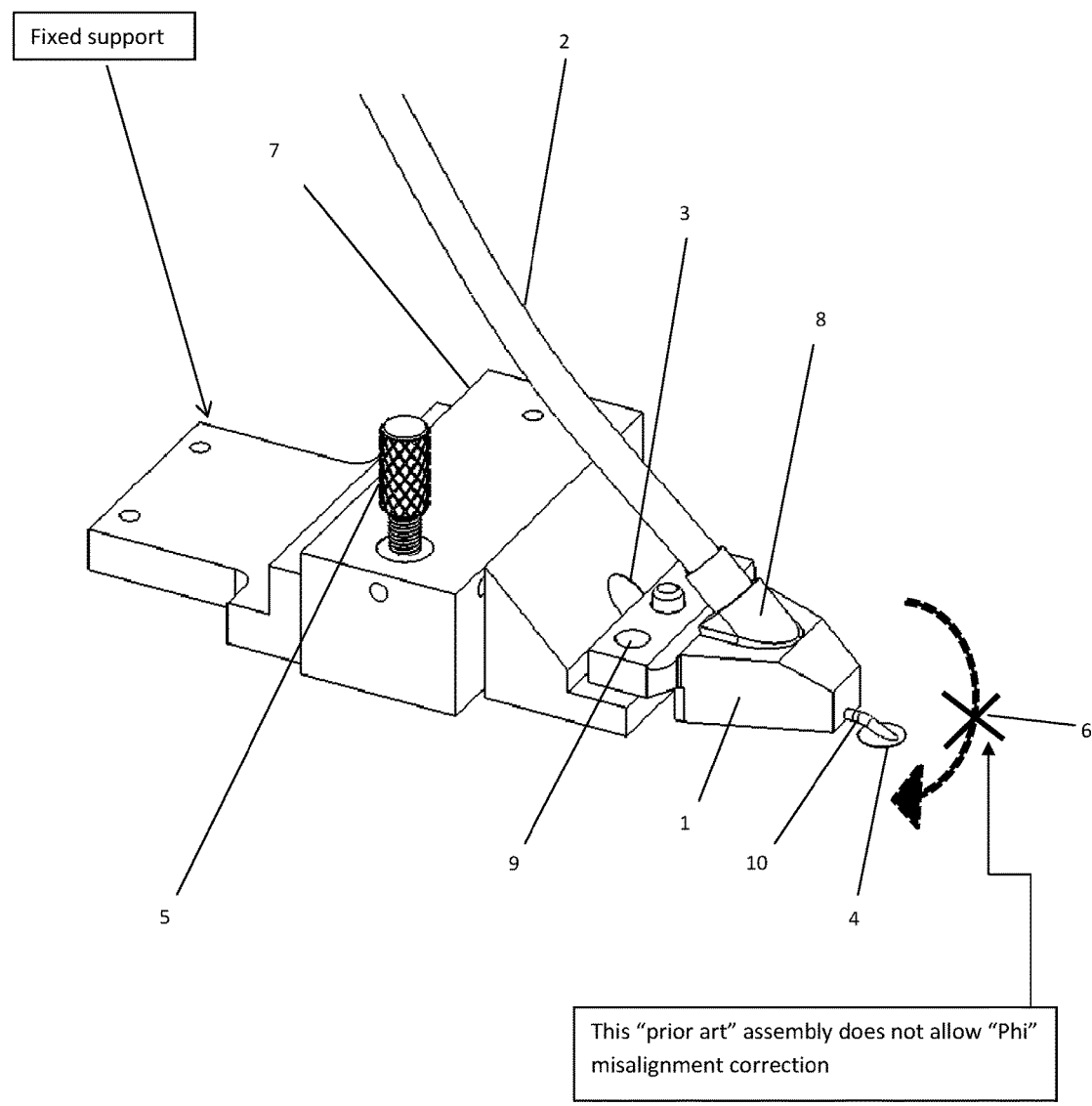
Figure 1 (prior art): picture of coaxial wafer probe holding assembly

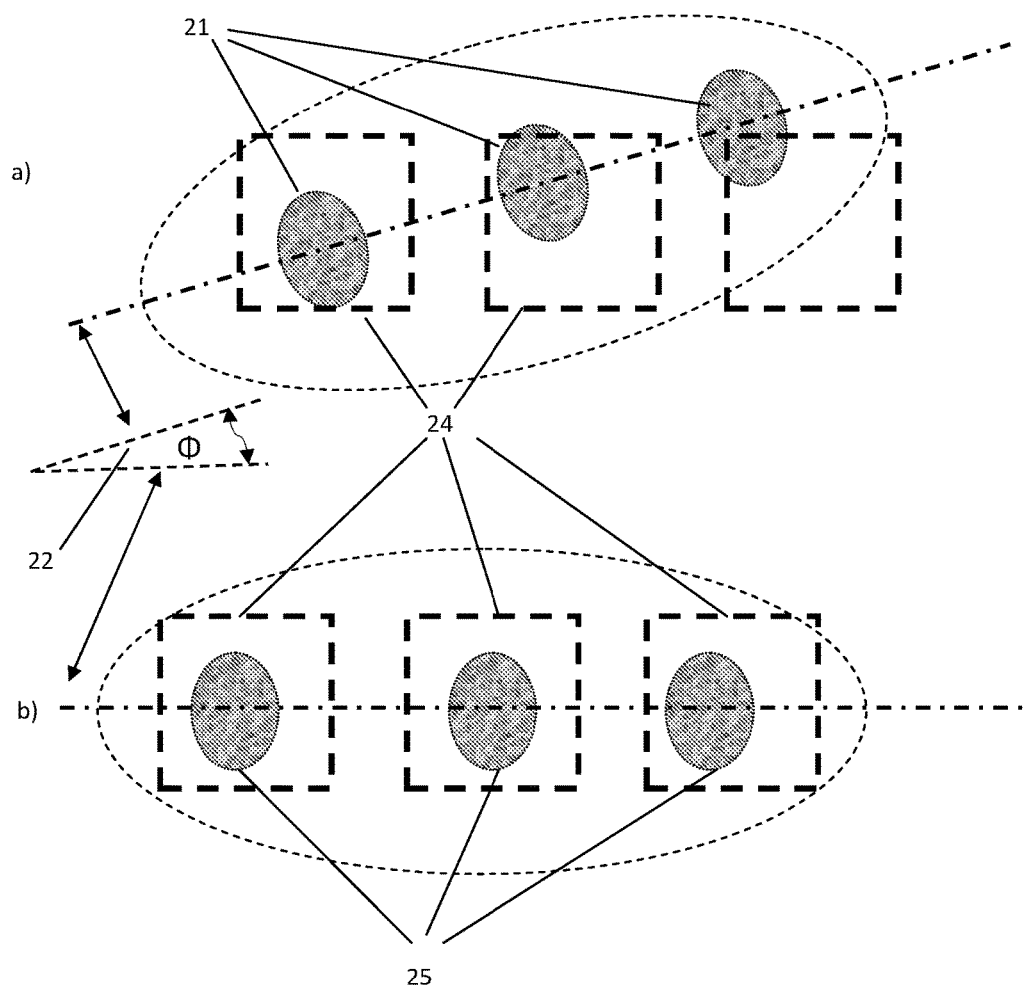
Figure 2 prior art: probe tip marks on wafer chip plots: a) misaligned, b) aligned

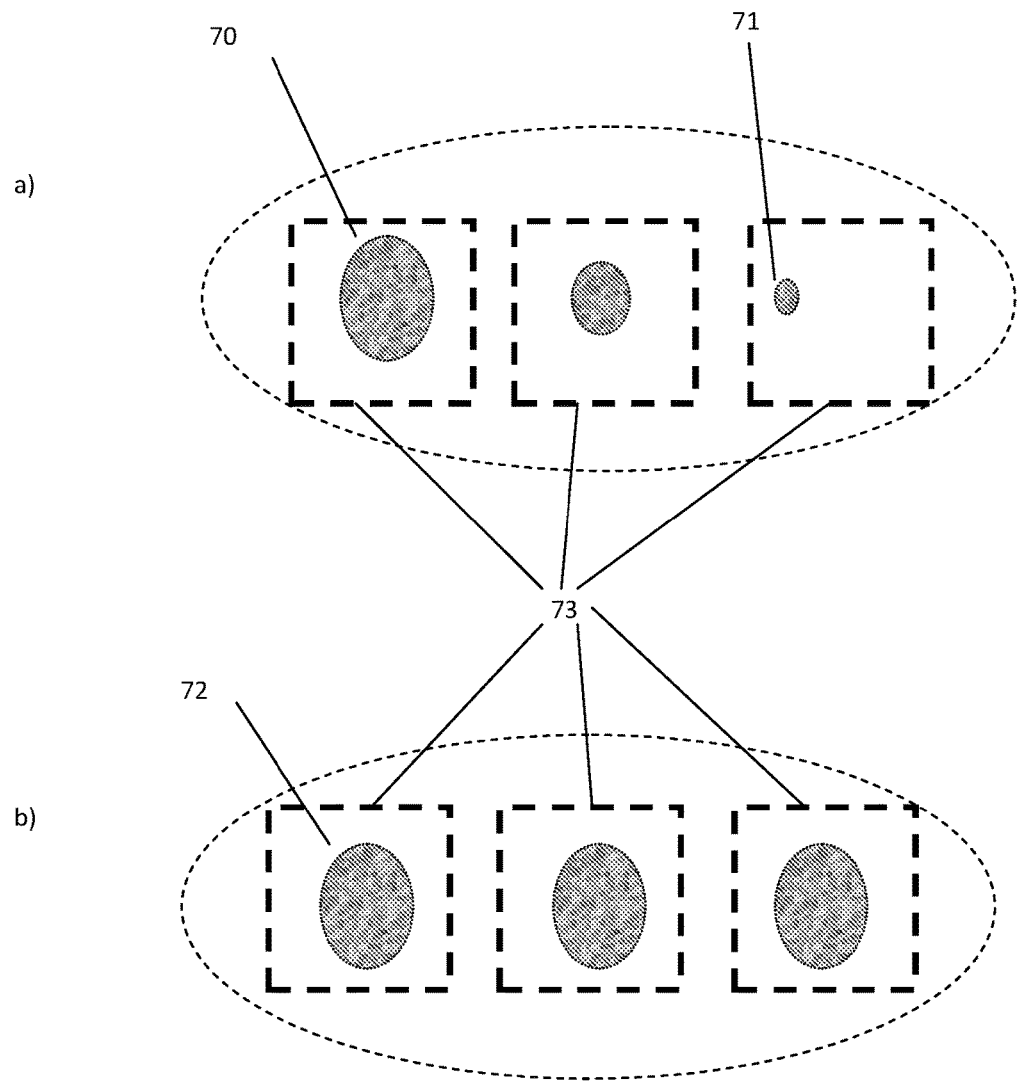
Figure 3: prior art: Pattern marks of probe tips (a) mis-aligned, (b) aligned

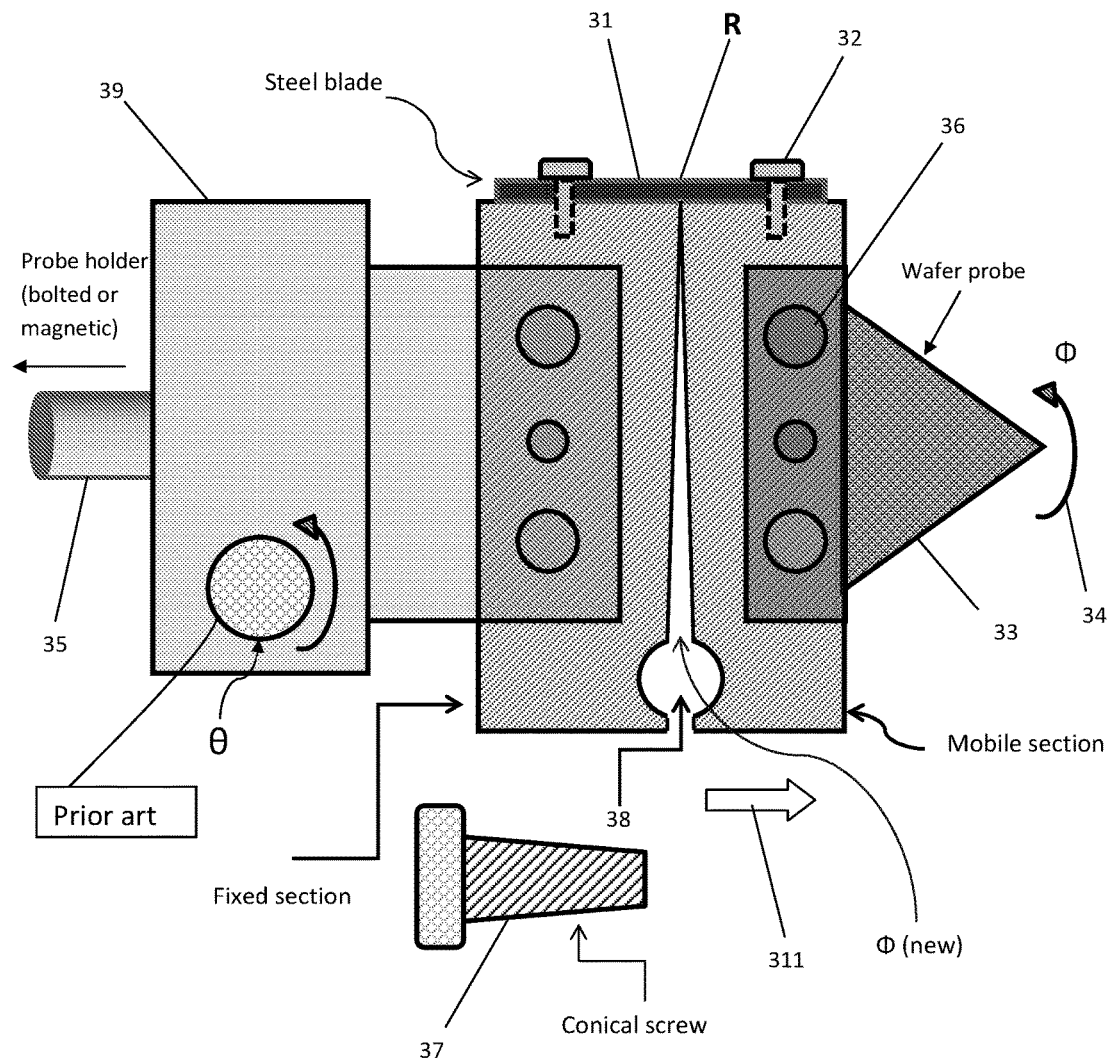
Figure 4: probe holder assembly with orientation (Φ) and planarity (θ) correction tools (top view)

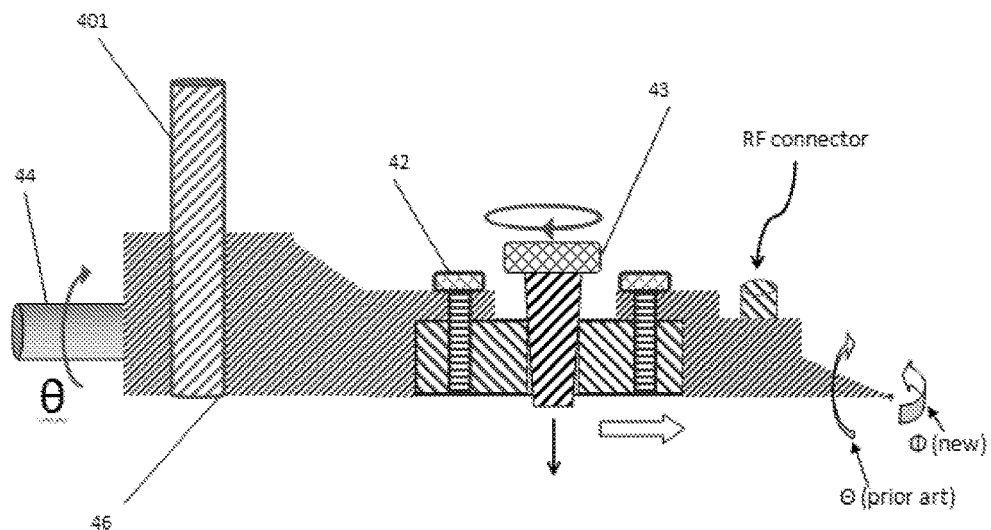
Figure 5: probe holder assembly with orientation (Φ) and planarity (θ) correction tools (top view)

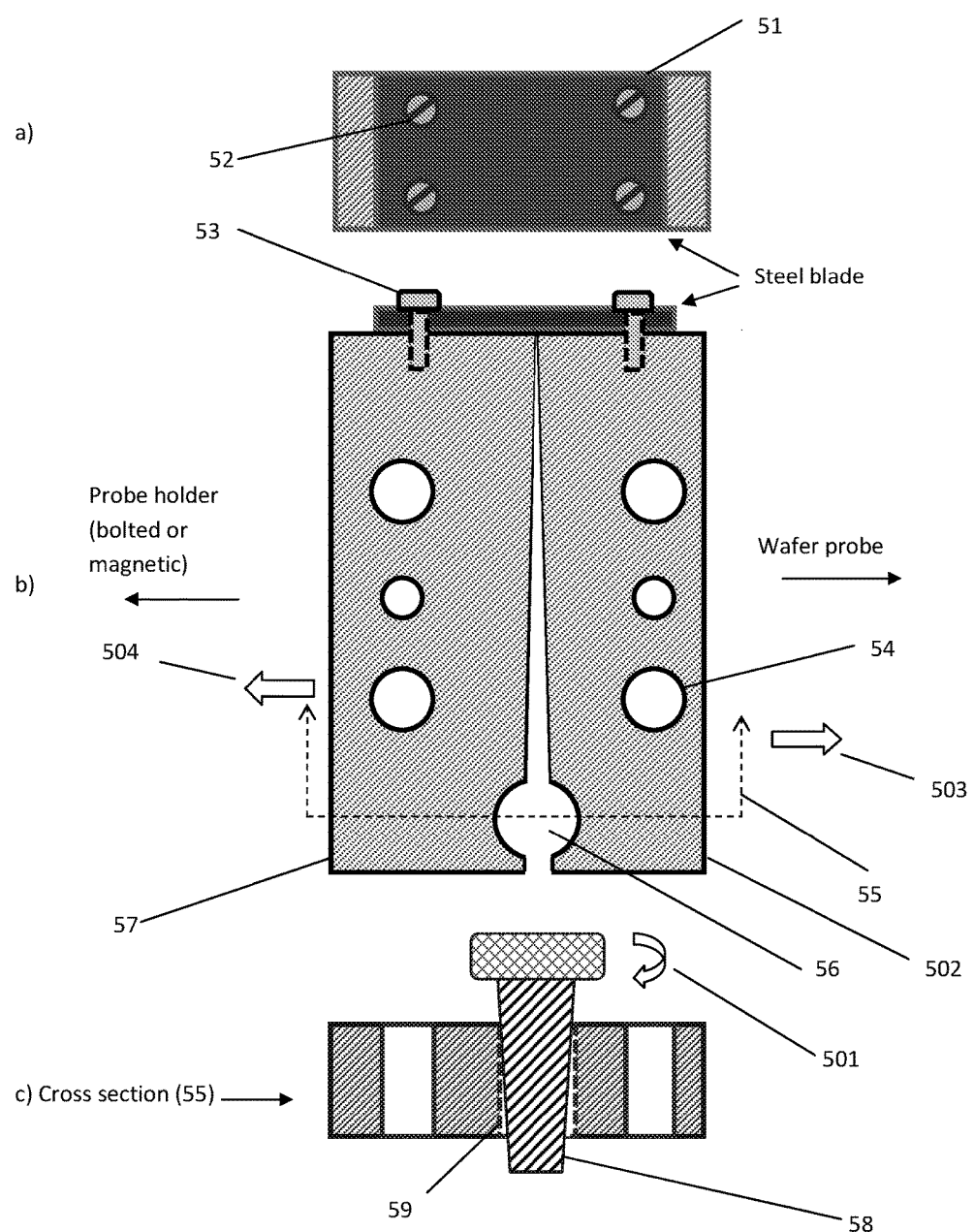
Figure 6: Orientation "Phi" (Φ) correction device

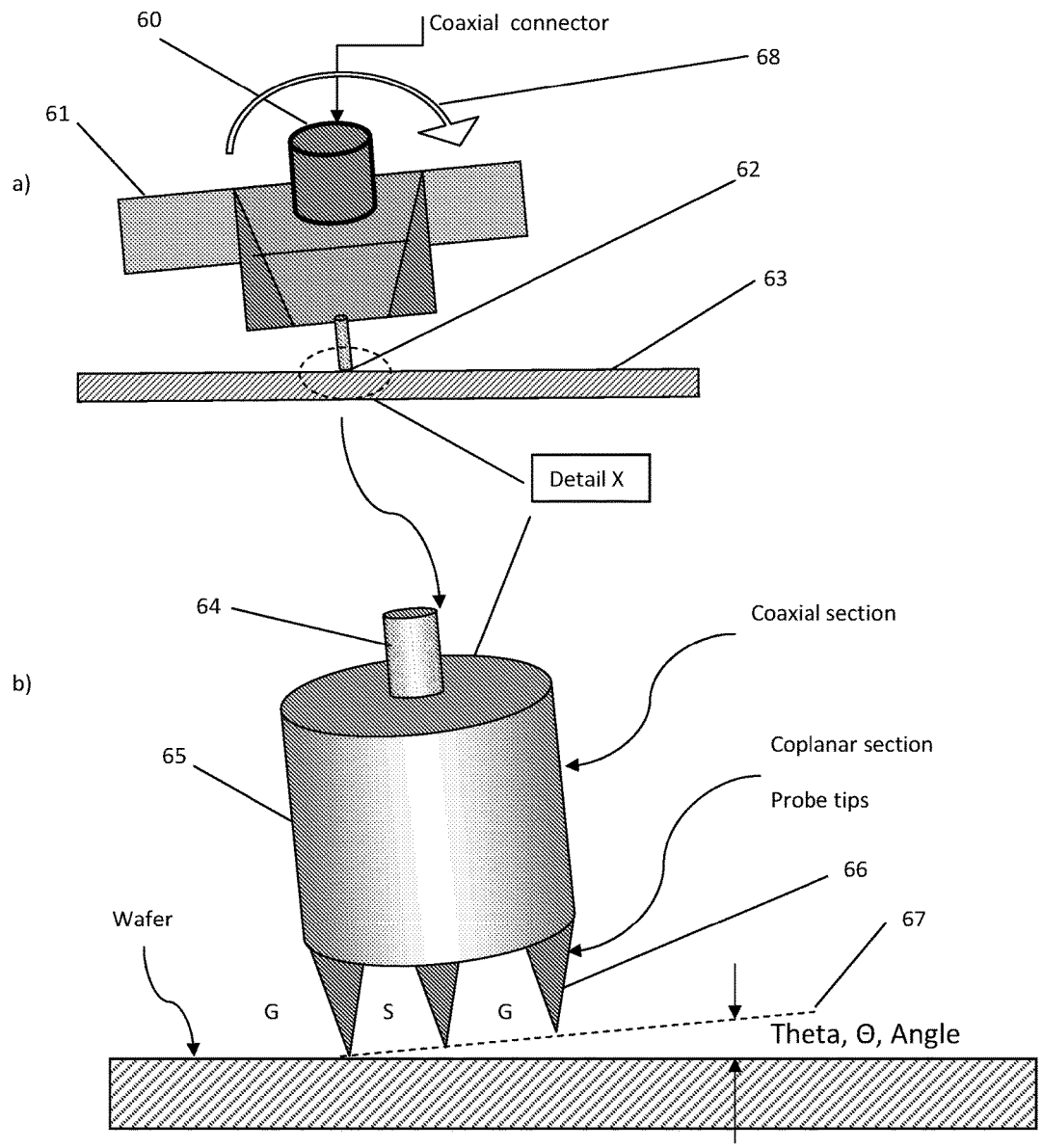
Figure 7: Planarity (Theta - θ) misalignment of probe (a) overall, (b) detail view

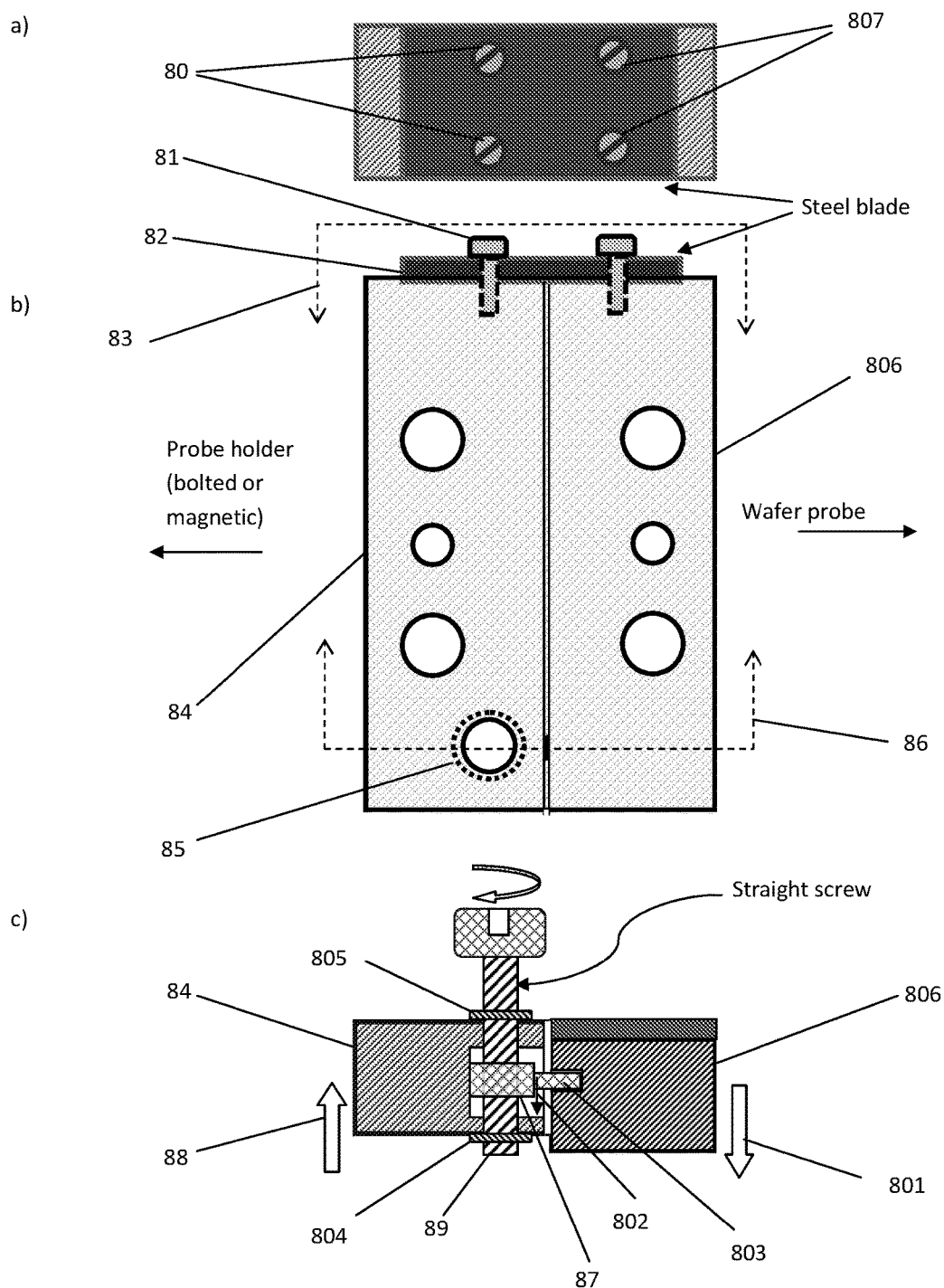
Figure 8: Alignment device for Planarity (Theta, θ)

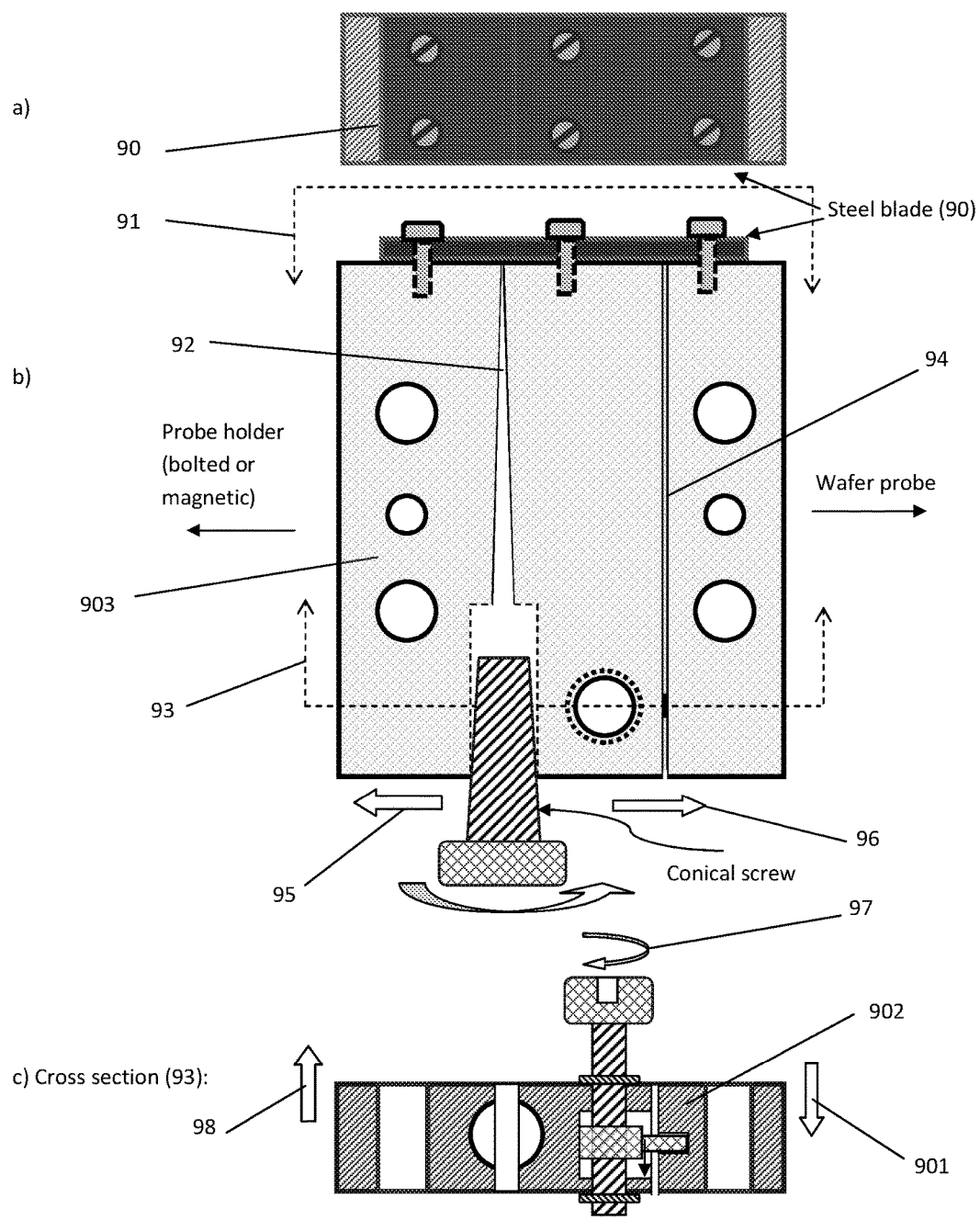
Figure 9: Combination alignment device for Planarity (Theta, θ) and Orientation (Phi, Φ)

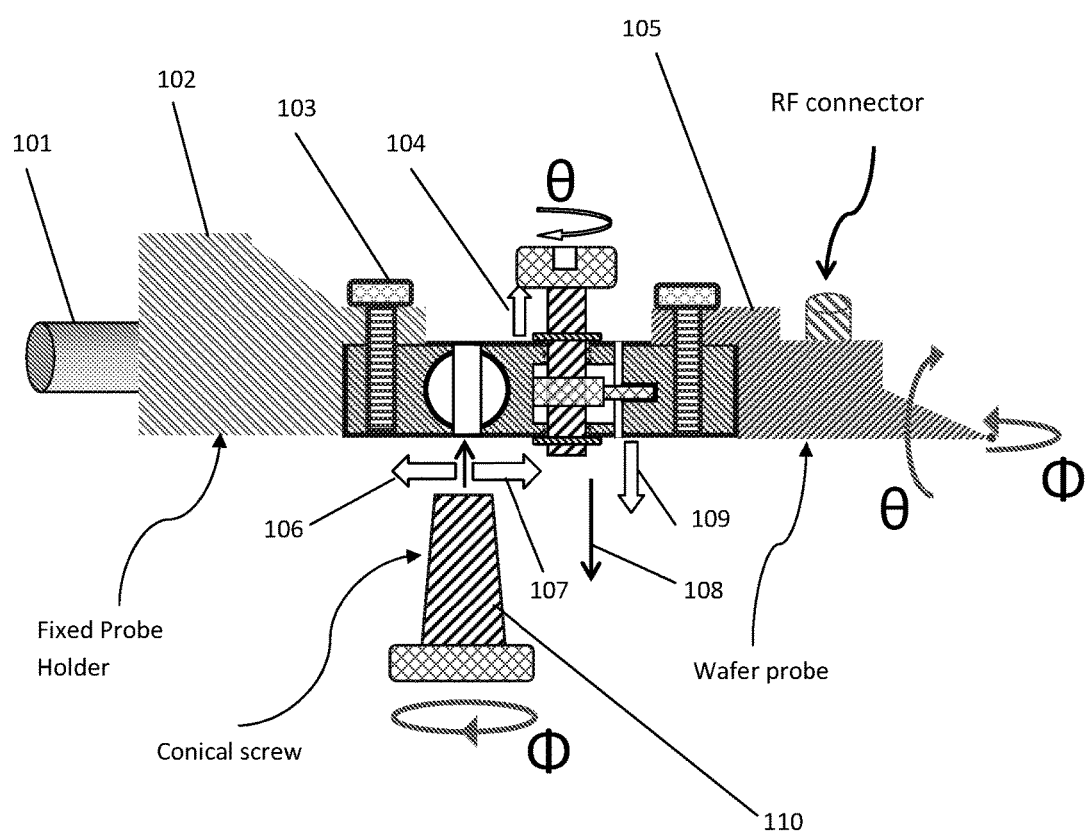
Figure 10: Assembly of combination alignment device (Theta, θ) and (Phi, Φ)

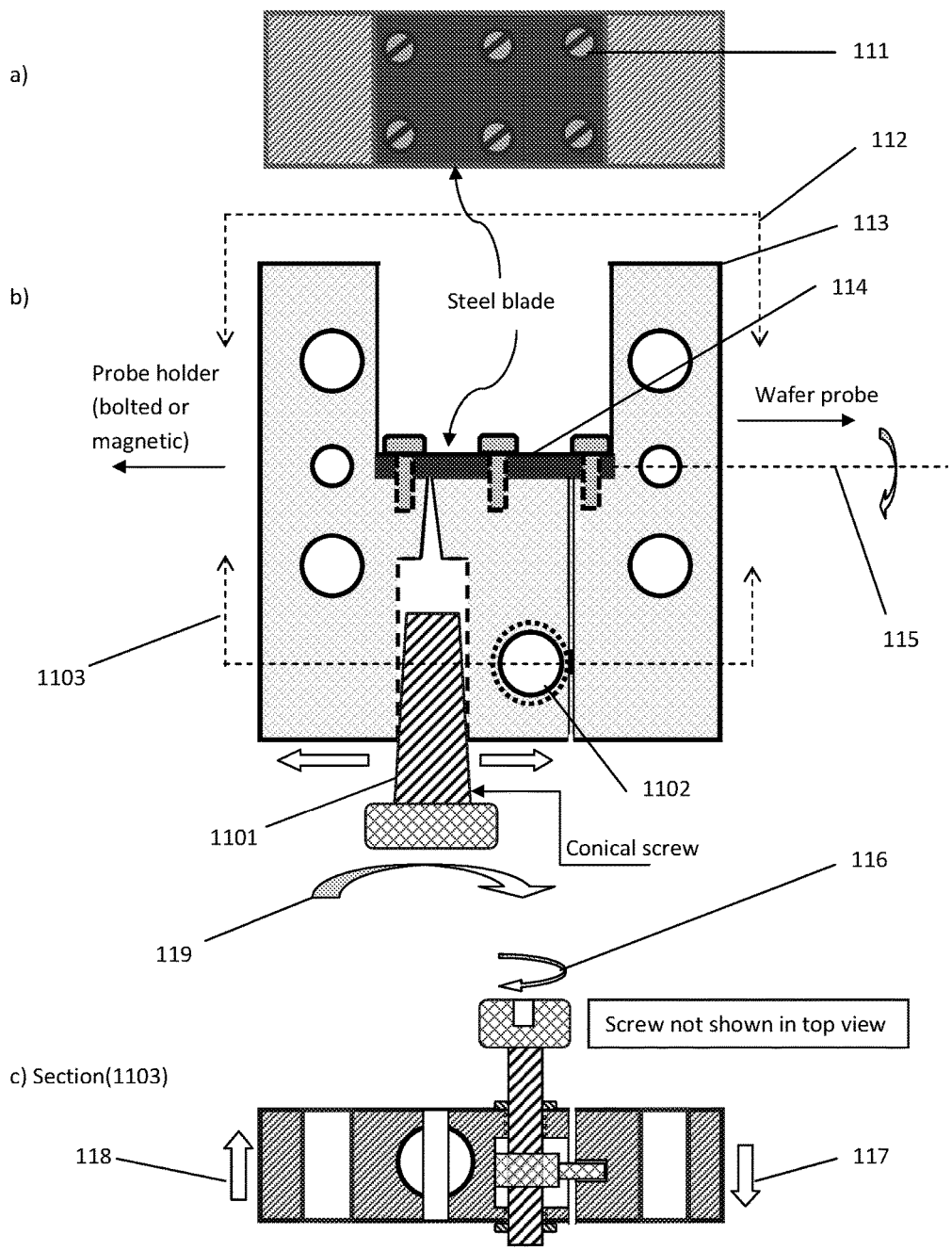
Figure 11: Assembly of combination alignment device (Theta, θ) and (Phi, Φ)

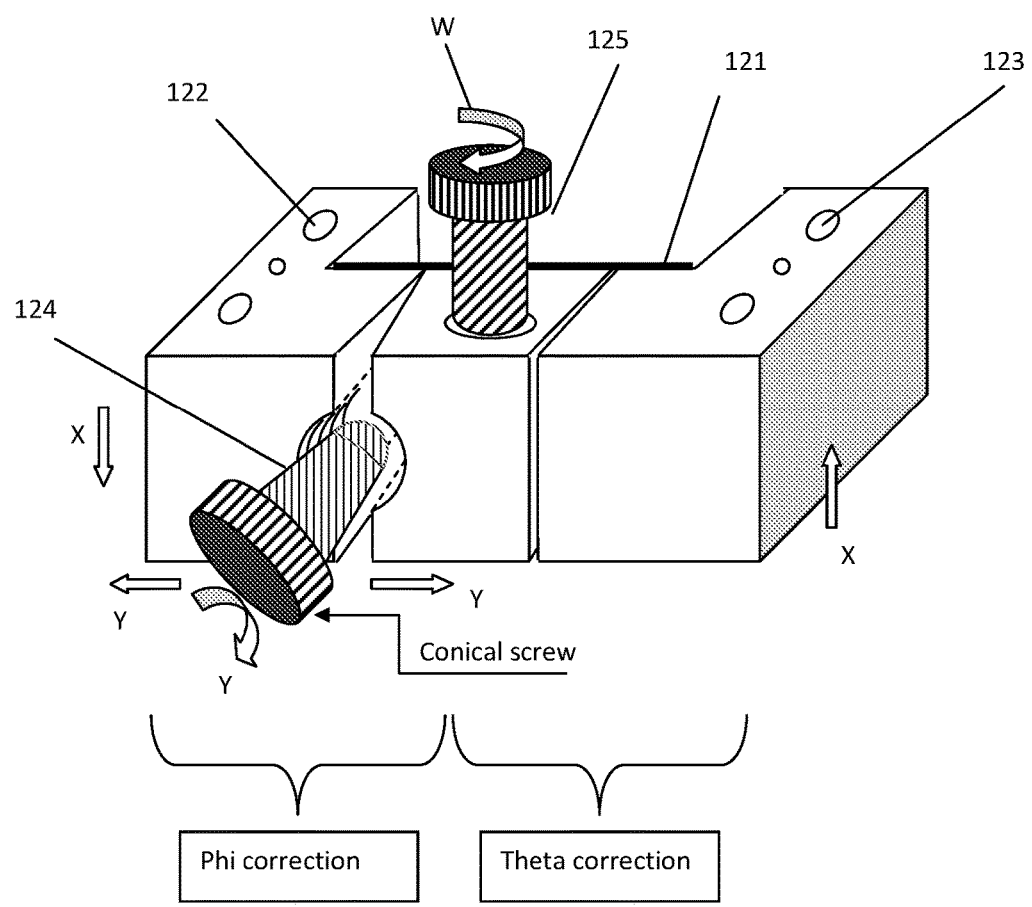
Figure 12: Perspective view of alignment device.

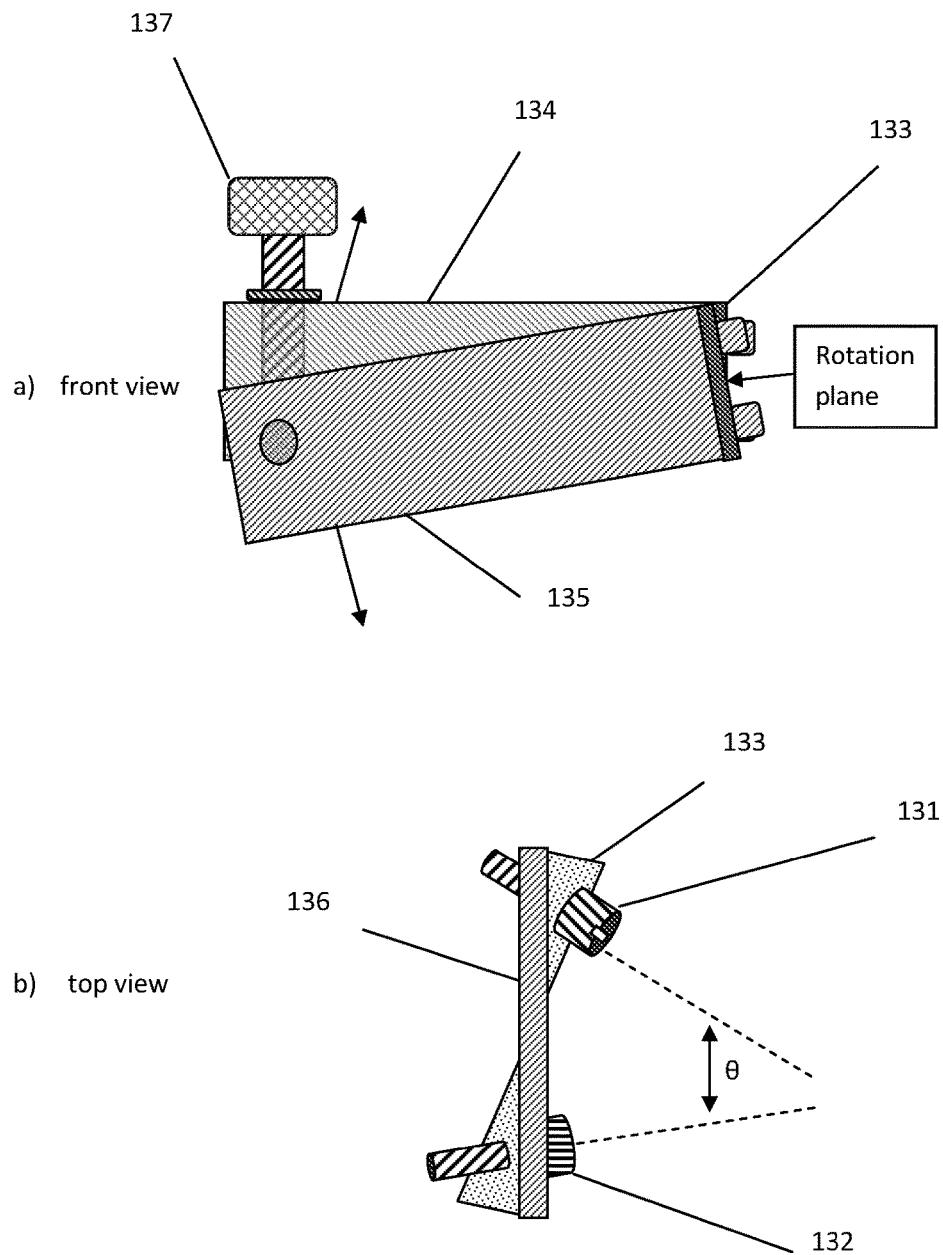
Figure 13: a) Rotation of sections for Theta correction; b) bending of mounting blade

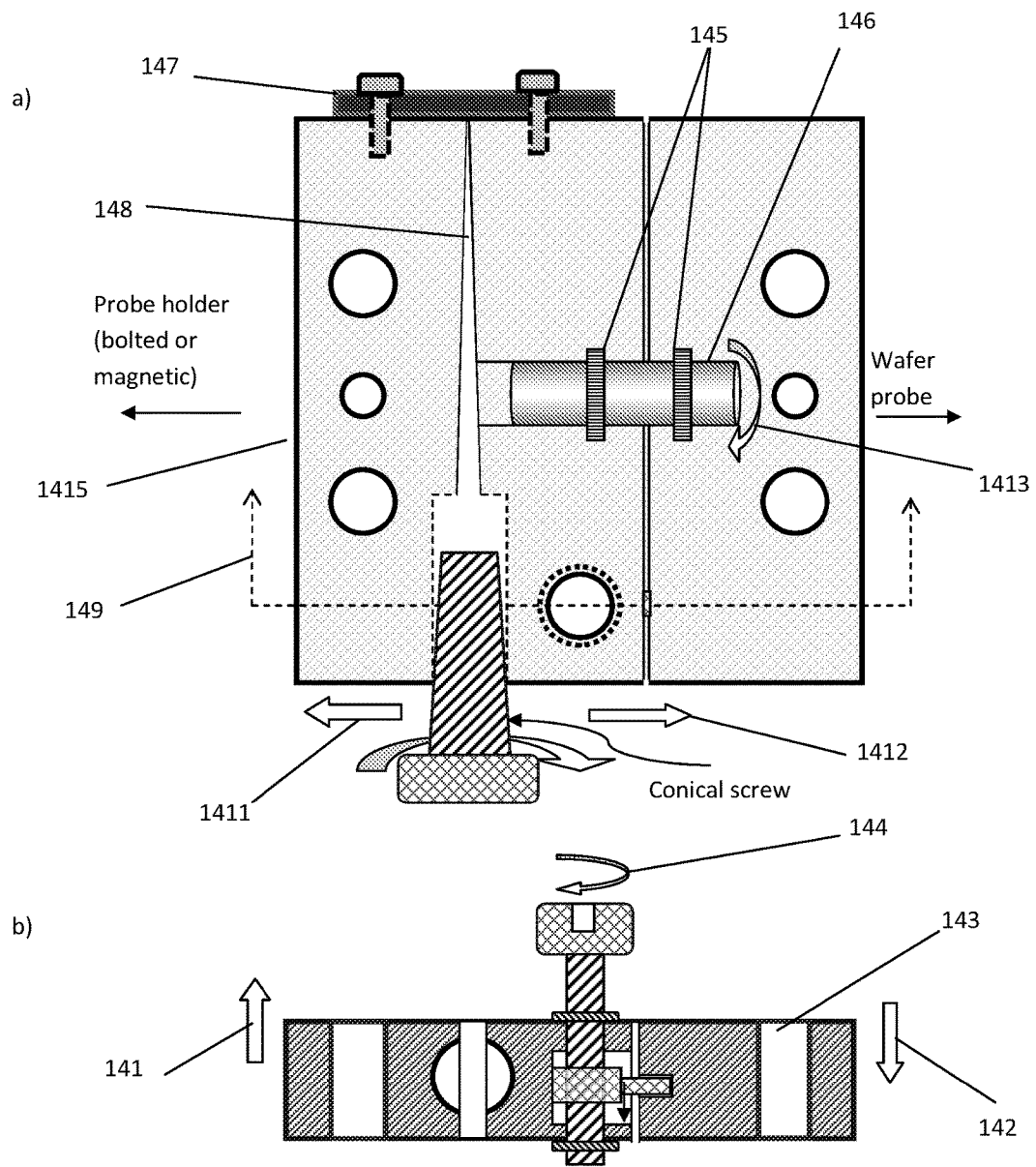
Figure 14: Combination device using rotation axis

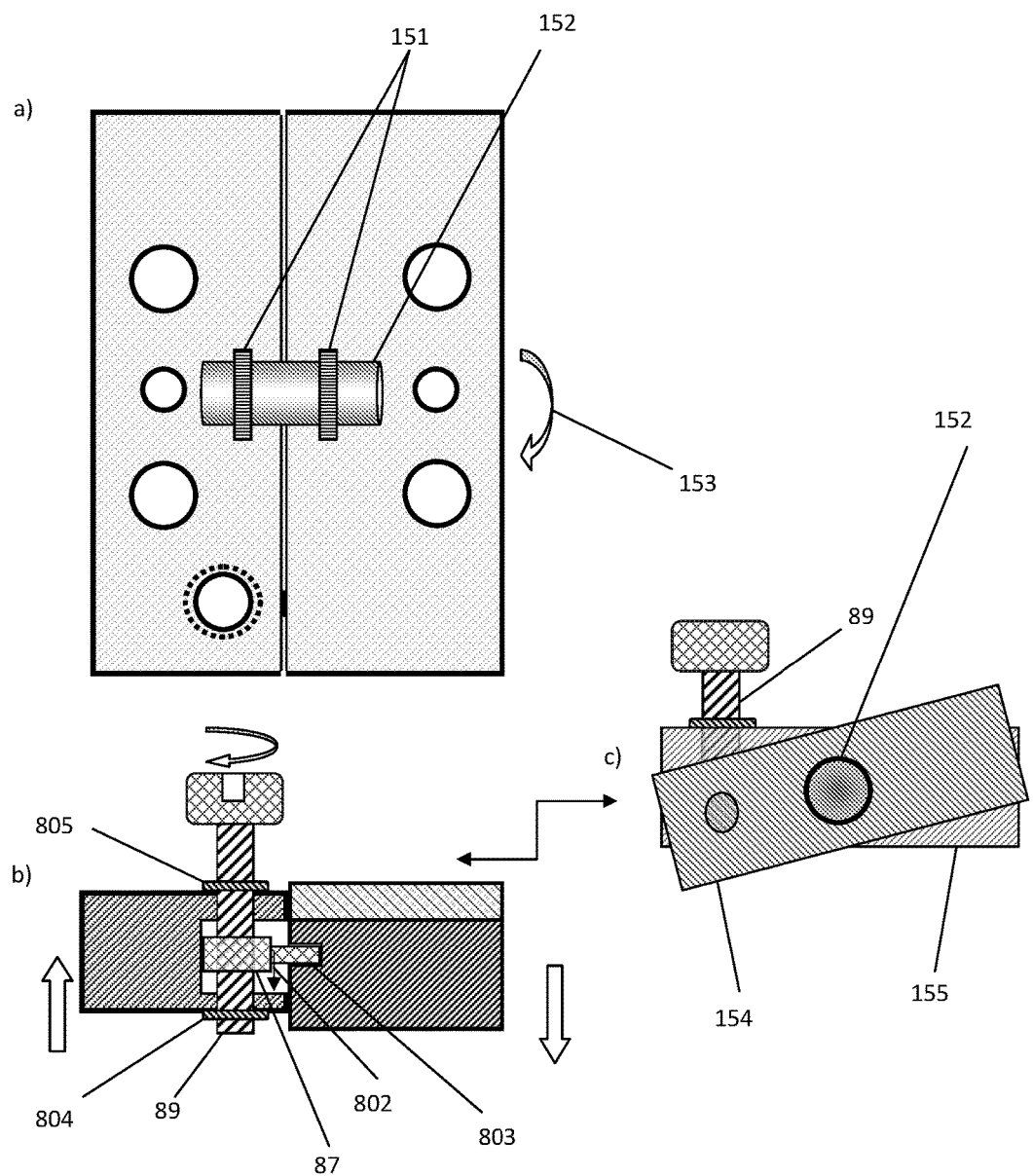
Figure 15: Theta correction device using rotation axis

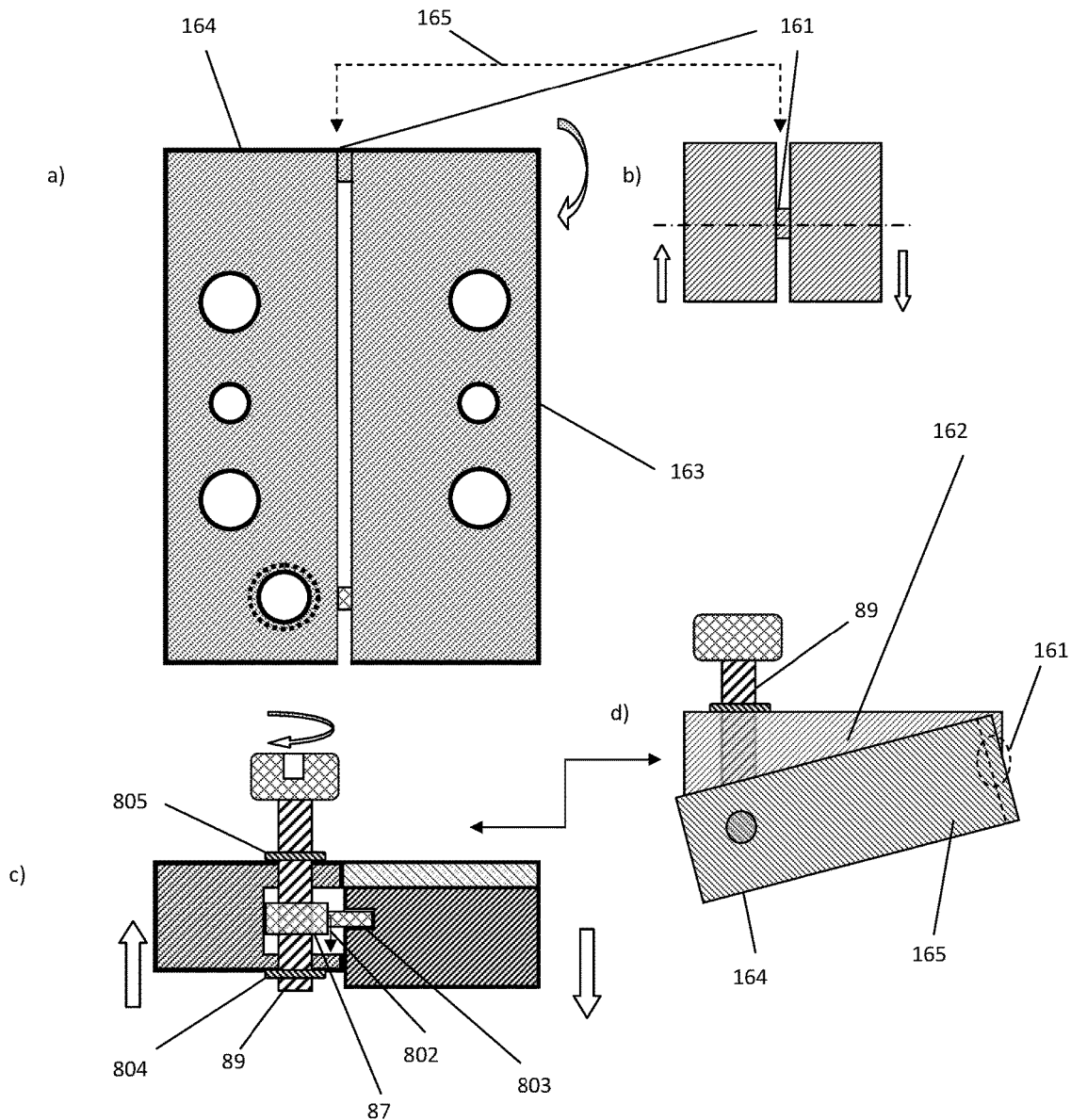
Figure 16: Theta correction device using two joined sections

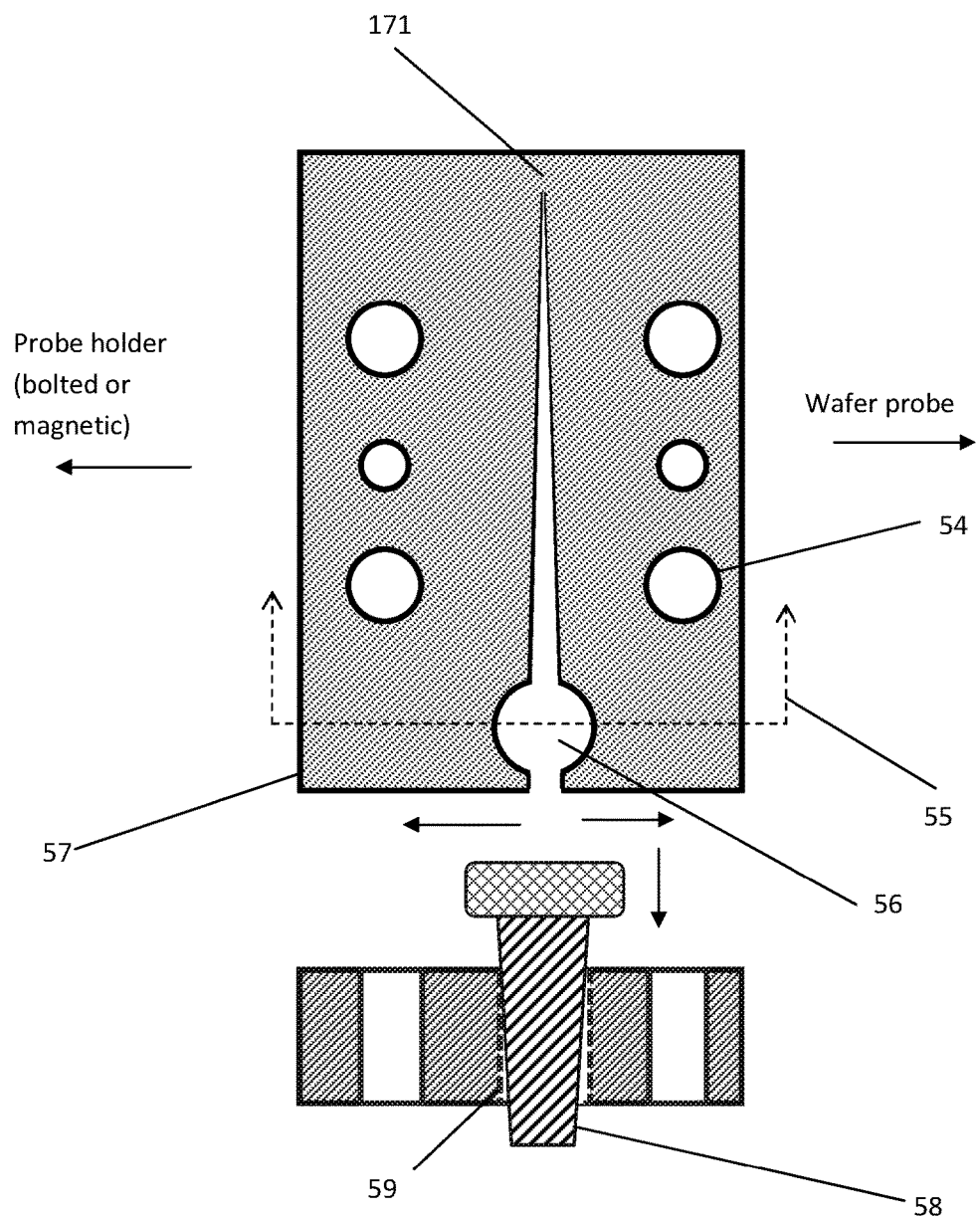
Figure 17: Phi correction device using two joined sections

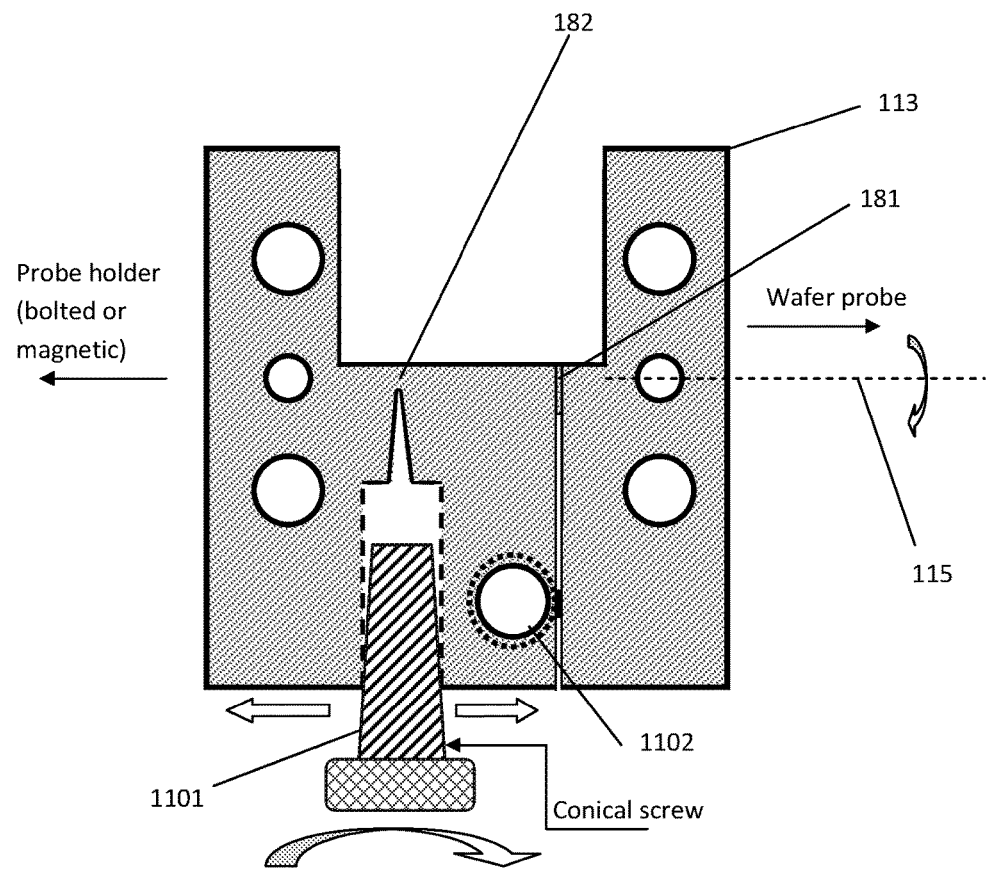
Figure 18: Combination device using inherent material flexibility as a joint

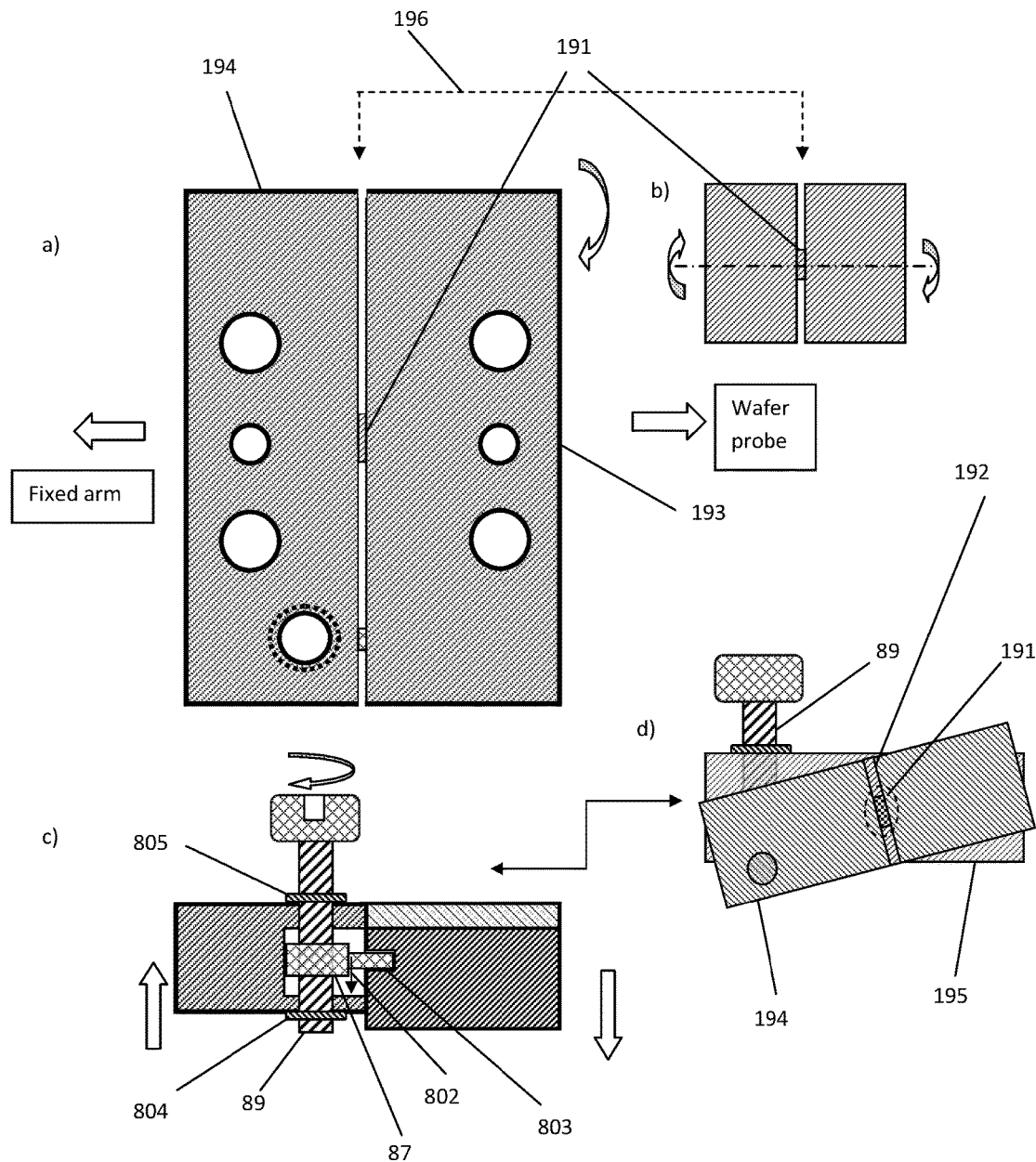
Figure 19: Theta correction device using two sections inherently joined in the center

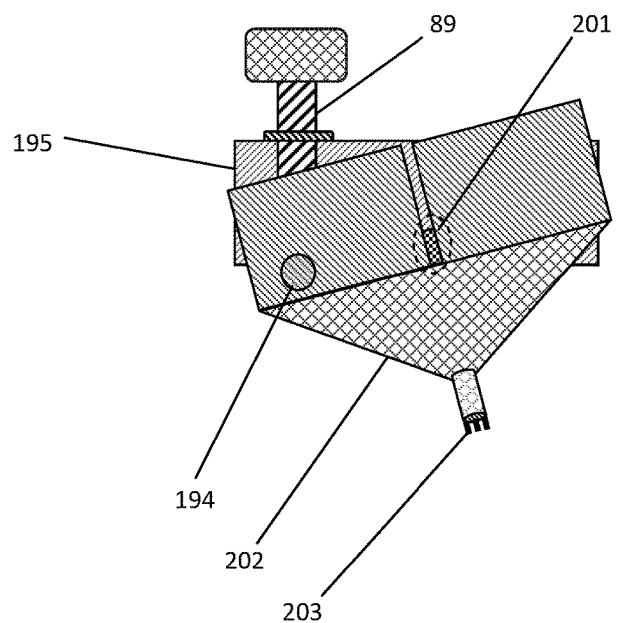
Figure 20: Theta correction device using two sections inherently joined close to the wafer tip rotation plane.

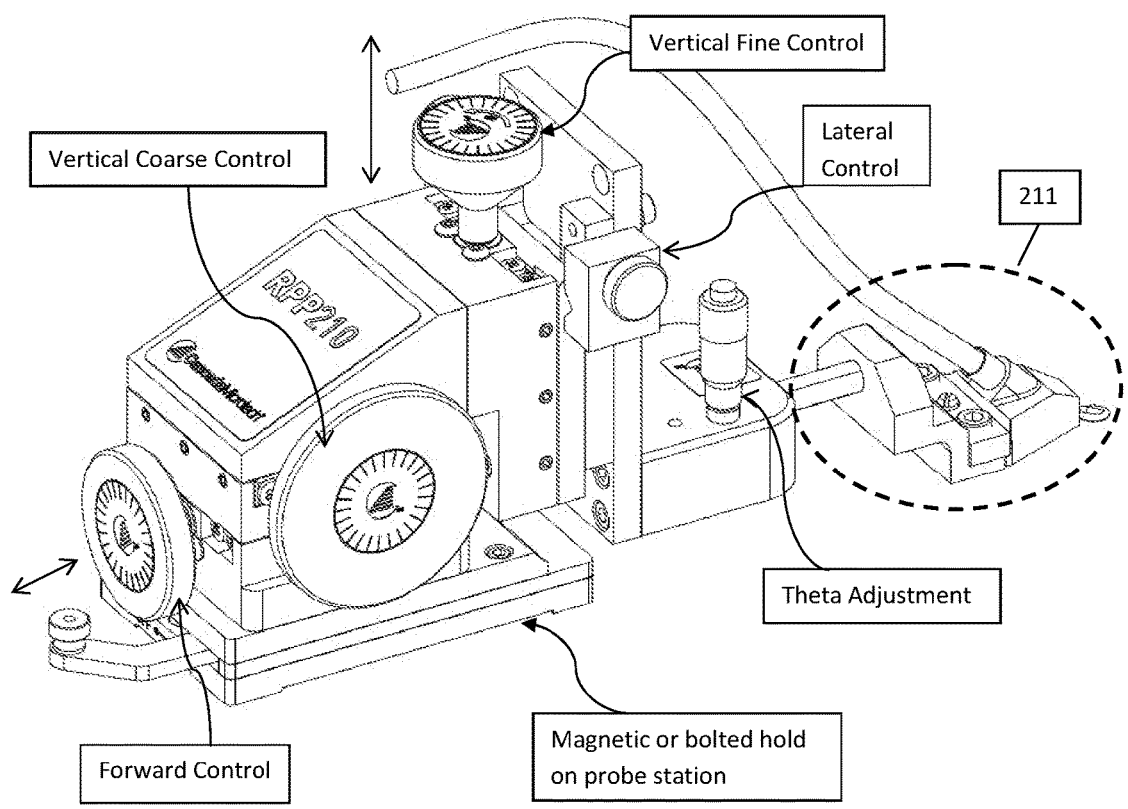
Figure 21: prior art, commercially available probe holder (from Cascade Microtech).

WAFER PROBE HOLDER FOR PLANARITY AND ORIENTATION ADJUSTMENT

PRIORITY CLAIM

This application claims priority on Provisional Application 61/748,234, filed on Jan. 2, 2013 entitled: "Wafer probe holder for planarity and orientation adjustment".

CROSS-REFERENCE TO RELATED ARTICLES

1. Cascade Microtech wafer probes: http://www.cascademicrotech.com/products/probes/rf-microwave/infinity-probe/infinity-probe
2. GGB wafer probes: http://www.ggb.com/40 m.html

BACKGROUND OF THE INVENTION, PRIOR ART

RF and microwave semiconductor chips (transistors, DUT's) are best characterized "on wafer", before cutting, bonding and assembling them at high cost. This also allows avoidance of parasitic connection elements, like wire bonds and fringe capacitors, which are associated with packaging the devices in order to mount them in test fixtures. It also allows a much larger number of devices to be tested "in situ" without having to laboriously slice the wafer, mount and wire-bond each individual chip. The "on wafer" testing is at this point of time the preferred testing method, except for high power devices, beyond 10-20 Watt RF power. On-wafer testing is also the exclusive testing method in millimeter-wave frequencies, since device packaging is extremely difficult and the parasitic elements associated with the package (inductance of wire bonds and fringe capacitors of package housings) could falsify the measured data to the point of uselessness.

A number of manufacturers (see ref. 1, 2) make wafer probes capable of reliably testing chips in GHz range frequencies. The wafer probes (FIG. 1, item (1) are made, usually, using small coaxial or coplanar sections (10) with diameters of the order of 1 mm (0.04") that end into a "coplanar" structure (4), (shown also in detail in FIG. 7b), where the center conductor of the coaxial section (cable) becomes the center conductor of the coplanar section and the ground mantle of the coaxial section (cable) ends up as the ground plane of the coplanar (FIG. 7b). The simple reason is that this is a practical way for the RF signal to be injected and retrieved from planar micro-chips, where all RF contacts are on the same surface (Ground-Signal-Ground or GSG configuration). Back in FIG. 1, it is visible how the coaxial cable is coupled into a coaxial connector (8) and attached to a coaxial cable (2) which leads to the test instrument.

Therefore at least three connection points (probe tips) are necessary to establish a proper RF contact in GSG (Ground-Signal-Ground) configuration (FIG. 6b). Since three probe tips do not necessarily form a straight line and since the probes themselves may be, microscopically, imperfect, due to the tiny dimensions involved (the typical gap between the three probe tips of the order of 150 micrometers ~0.006") and because of unavoidable manufacturing tolerances, it often happens that the contact between the probe tips (21, 70, 71, 72), and chip contact plots (23, 24) is disoriented (FIG. 2a) and uneven and unreliable (73, FIG. 7a). Prior art probe holder (FIG. 21) does not provide for a lateral disorientation correction ("Phi" angle), defined in FIGS. 2 and 6. Up to now such disorientation was corrected by rotating the whole probe holder (FIG. 21) on its magnetic base. No fine adjustment has been possible. The present disclosure does not claim inventorship on the whole apparatus of FIG. 21. The apparatus of FIG. 21, up to the left limit of the dotted contour (211) is considered here "fixed support" (FIG. 1),

BRIEF DESCRIPTION OF THE DRAWINGS

The invention will be better understood in view of the enclosed drawings whereby FIG. 1 depicts prior art: picture of coaxial wafer probe holding assembly.

FIG. 2 depicts the (new) definition of orientation misalignment ("Phi"—Φ) between the axis of the probe tips marks (21, 25) and the axis of the chip plots (24): a) misaligned, b) aligned.

FIG. 3 depicts prior art: planarity ("Theta"—Θ) marks of probe tips (a) mis-aligned, (b) aligned.

FIG. 4 depicts probe holder assembly with Φ (new) and Θ (prior art) correction.

FIG. 5 depicts probe holder assembly with orientation (Φ) and planarity (Θ) correction tools (top view).

FIG. 6 depicts Orientation (Φ) alignment device.

FIG. 7 depicts Planarity (Theta—Θ) misalignment of probe (a) overall, (b) detail view.

FIG. 8 depicts the alignment device for Planarity (Theta, Θ).

FIG. 9 depicts the combination alignment device for Planarity (Theta, Θ) and Orientation (Phi, Φ).

FIG. 10 depicts Assembly of combination alignment device ("Theta", Θ) and ("Phi", Φ)

FIG. 11 depicts assembly of combination alignment device ("Theta", Θ) and ("Phi", Φ)

FIG. 12 depicts perspective view of alignment device.

FIG. 13 depicts: a) Rotation of sections for "Theta" correction; b) bending of mounting blade.

FIG. 14 depicts "Theta" and "Phi" correction Combination device using rotation axis.

FIG. 15 depicts "Theta" correction device using rotation axis.

FIG. 16 depicts "Theta" correction device using two joined sections.

FIG. 17 depicts "Phi" correction device using two joined sections.

FIG. 18 depicts "Theta" and "Phi" correction Combination device using inherent material flexibility as a joint.

FIG. 19 depicts "Theta" correction device using two sections inherently joined in the center.

FIG. 20 depicts "Theta" correction device using two sections inherently joined close to the wafer tip rotation plane.

FIG. 21 depicts prior art: commercially available probe holder (from Cascade Microtech) showing all available positioning controls; it is significant to realize that there is no "Phi" adjustment capability (as in this invention, FIGS. 12, 14, 17). The present invention concerns only area (211) of the depicted device.

DETAILED DESCRIPTION OF THE INVENTION

It is therefore necessary to have an orientation adjustment and a planarization option: in the art of semiconductor device testing the planarity misalignment angle between the chip-plot surface and the surface through the probe tips is called "Theta" (Θ, FIGS. 6, 7); the process of aligning the probe tips with the chip-plot surface is called "Theta adjustment" or "Theta alignment".

The disorientation of the probe tips (21) relative to the chip contacts (23) must also be corrected, since it may create unreliable contact; this is shown in FIGS. 2a, 2b. This misalignment we call hereby "orientation error" and we attribute to it the letter "Phi" (<Φ>), (22). The process of correcting this misalignment we hereby call "Phi adjustment" or "Phi alignment".

Therefore the wafer probe shall be planarized (Theta correction) and oriented (Phi correction). Up to now only a Theta correction technique has been known, FIG. 1; it consists in rotating the whole holder (7) holding the probe around the axis (3). This is implemented using a micrometer screw (5). The probe itself (1) is mounted on the holder (7) using two vertical screws (9). This arrangement does not allow an orientation (Phi) correction (6).

This invention discloses, in a first embodiment, a device which allows adding a Phi correction to the prior art Theta correction (FIGS. 4, 5 and 6); and, in a second embodiment, a second device, which combines a new method for Theta correction combined with a Phi correction; said second device made as a single probe holding unit (FIGS. 9 to 13). In particular the angle adjustment mechanism is outlined in FIG. 6: when the conical screw (58) is inserted into the straight thread (59) by winding (501), then the two blocks (57) and (502) are spread apart (503) and (504) and changes the orientation angle Phi.

The principle of the Theta correction device stand-alone is described in FIGS. 8 and 13: the block sections (84 and 806) are joined by a flexible steel (but strong enough) blade (82 in FIG. 8, 133 in FIG. 13), which is firmly attached on the side of said block sections by four screws (80, 81, 131, 132); this mounting arrangement allows the mobile section (806 in FIG. 8, 134 in FIG. 13) of said device to rotate around the "rotation plane" (FIG. 13) vertically (801) against the other section (84, 135) when pushed by the pin (803 in FIG. 8) which is attached to the screw (89); the screw (89) is locked vertically with the body of the immobile block (84) using two lock-washers (804, 805); the adjustable angle Theta (θ) cannot be seen in FIG. 8, but is shown in FIG. 13 as the angle between the axes of the mounting screws (131, 132); it is the same angle between the plans of the two sections (134 and 135); screws (131) correspond to screws (80) and (807) are mounted on the two sections of the device to allow flexible tilting; screws (132) correspond to screws (807) and screws (80) correspond to screws (131) and each set is mounted on different sections of the device; this allows the two sections to rotate (tilt) against each-other around the center plane (136) of the steel blade (82, 133).

The principle of the Phi (<Φ>) correction (34) of the wafer probe (33) is shown best in FIGS. 4, 5 and 6. FIG. 6 shows the concept of the Phi correction device itself, whereas FIGS. 4 and 5 show said device mounted on a prior art probe holder (39), which has already the (prior art) Theta correction incorporated; this way the Phi correction is added to the prior art Theta correction (θ). The Phi correction works by inserting a conical screw (37) into a thread (38) cut into the device. The device itself is cut in two sections—a fixed one and a mobile one. They are hold together by a steel blade (31) and a set of screws (32). This allows the conical screw (37) to spread the two sections apart, when inserted into the threaded hole (38). This way the mobile section will move (311) and the probe (33), which is mounted using typically two screws (36) on said mobile section, will travel on an arc around the center plan 'R' (which is on the blade (31)) and rotate (34). In this configuration the Theta planarization is made using the prior art micrometer screw (5, 401) which, using a (not shown) internal mechanism, rotates the holding section (46, 39, 7), which is a preferred prior art embodiment of the Theta correction mechanism, around the axis (35, 44) as shown in the FIGS. 1, 4 and 5. FIG. 4 shows a side view the overall assembly of the (new) Phi correction device (41) with the prior art Theta correction mechanism (401, 44, 46).

FIGS. 9, 12 and 14 depict embodiments of a combination device, which allows both Theta and Phi corrections without using prior art techniques. In FIG. 9, the segment that allows the Theta correction (902) is attached to the segment which allows the Phi correction (903) using the steel blade (90). The segment (903) is itself sectioned (92) to allow an opening (95, 96) when the conical screw is wound in. The Theta correction uses the flexibility of the same steel blade to allow rotation of the attached segments, as shown in FIG. 13.

FIG. 12 depicts a perspective view of the device of FIG. 9. The winding "W" of the vertical "straight" screw (125) causes the up-down "X" movement and ensures the Theta correction; The "Z" rotation causes the "conical" screw (124) to enter between the two segments of the Phi correction block and cause the movements "Y". All three segments are in fact separated from each-other and held together by a single steel blade (121), which allows both lateral and vertical flexion. On one side of the device the fixed setup holder bracket (FIG. 1) is mounted in the holes (122) and, on the other side, the wafer probe is mounted in the holes (123).

FIG. 11 depicts a combination device (113) in which the steel blade (114) is positioned close to the center of the Theta rotation axis (115) thus allowing to avoid the "arc" movement (34) of the configuration in FIG. 3. An alternative method for the Theta rotation is shown in FIGS. 14 and 15. The blade (147) is not extended beyond the Phi correction segment (1415). Instead rotation (1413) is allowed using a pin (152, 146) which is inserted between the two parts of the Theta block and secured using two snap washers (151, 145). This solution is more traditional than the blade solution but bears the disadvantage of backlash: The rotating part holding the probe will have a play as defined by the tolerance of the pin (803) entering the moving block. Instead the blade (90, 114) will always push against the lifting pin (803) thus eliminating the play and backlash.

The rotation mechanism of the Theta correction is best depicted in FIGS. 13a and 15c in a side view. In FIG. 13a the block (135) tilts downwards when pushed by the screw (137). The rotation axis is in the center of the blade (136) which torques downwards. Since the rotation axis and the probe-tip axis are not identical the probe will necessarily move on an arc while tilting. This effect is mitigated when the rotation axis is placed close to the probe-tip axis (FIGS. 11 b) and 14 a)). In the case of FIG. 15, the block (154) tilts downwards when pushed by the screw (89). The rotation axis (152) is placed close to the probe axis, thus avoiding the "arc" movement (34). The backlash issue mentioned before could be avoided by adding retaining springs between the two blocks (154) and (155) to push against the force of the screw (89).

The same effect as before can be achieved if the adjustment device is partly or totally manufactured from a single plastic or metallic piece (FIGS. 16 to 19). In FIG. 16 the spring loaded rotation mechanism is made using simply part of the device material. The two sections of the device (164 and 163) are not manufactured separately; instead a single block is sectioned in such a shape as to leave a small amount of material (161) close to the vertical center of said block joining the two sections. Beyond that the device operates equivalent to having a steel blade joining the two sections. Obviously the choice of material for the device is important in order to allow some flexibility. Bronze or plastic would be a preferred choice.

In FIG. 17 the Phi adjustment is also ensured using part of single block sectioned such as to leave a small section (171) for spring loaded pressure against the conical screw (58) as seen in view (55).

FIG. 18 shows a combination (Theta-Phi) alignment device made all out of a single metallic or plastic block. The Phi adjustment is allowed using the lateral flexibility of the material in area (182) whereas the Theta adjustment uses the rotational flexibility of the material in section (181).

In FIG. 19 an embodiment is shown whereby the Theta adjustment employs a section of the same block, left over in the center between said blocks after removing all surrounding material. This ensures a Theta rotation close the axis of the probe tips. If the probe tips are lower than the center of the correction block, the joining piece (201) can be placed lower to be as close as possible to the height of the probe tips (203) of the probe (202), (FIG. 20).

The devices disclosed here to allow correction of Theta and Phi wafer probe misalignments are described in a number of preferred embodiments. A number of obvious mechanical additions and alterations are imaginable but shall not impede on the basic idea of a single, compact device interfacing a fixed probe holder and a wafer probe, which allows a simple correction for either lateral or rotational misalignment or the combination of both.

What is claimed is:

1. A device allowing planarity (Theta) and orientation (Phi) alignment of the probe tips of wafer probes against semiconductor chips on wafer, comprises two modules attached to each-other,
    a first module for Theta correction (Theta module) and a second module for Phi correction (Phi module),
        whereby the Theta module controls the parallelism of the axis connecting the probe tips relative to the wafer surface, and comprises two sections attached to each-other using a flexible joint, which allows the sections to rotate against each-other around an axis perpendicular to the axis connecting the wafer tips;
        and whereby the Phi module comprises two sections connected at one end using a flexible joint and separated at the other end,
    whereby the separation plain is perpendicular to the wafer surface,
    and whereby the opening at the separated ends can be adjusted using a screw;
    and whereby one section of the Theta module is attached to one section of the Phi module,
    the other section of the Theta module is attached to the body of the wafer probe,
    and the other section of the Phi module is attached to a fixed support.

2. A device as in claim 1,
    whereby one section of the Phi module is attached to one section of the Theta module,
    the other section of the Phi module is attached to the body of the wafer probe,
    and the other section of the Theta module is attached to a fixed support.

3. A device as in claim 1 or 2 made of metal.

4. A device as in claim 1 or 2 made of plastic.

5. A device as in claim 1 or 2, whereby the flexible joints are thin steel blades or pieces of plastic.

6. A Theta alignment module as in claim 1, whereby the flexible joint is placed on the side of the sections.

7. A Theta alignment module as in claim 1, whereby the flexible joint is placed in the center of the sections.

8. A Theta alignment module as in claim 1, whereby the flexible joint is a rotation pin placed at the rotation axis in the center of the sections.

9. A Phi module as in claim 1,
    whereby the sections share a common threaded hole of which approximately half is part of one section and half is part of the other section, and which is placed approximately opposite to the flexible joint,
    and whereby a conical screw is inserted into the threaded hole and controls the opening between the sections, thus controlling their mutual parallelism and the orientation of the axis of the probe tips.

* * * * *